United States Patent [19]
King

[11] Patent Number: 5,365,182
[45] Date of Patent: Nov. 15, 1994

[54] METHOD AND APPARATUS FOR LOW POWER CLOCK GENERATION FOR HIGH SPEED APPLICATIONS

[75] Inventor: Thomas M. King, Tempe, Ariz.

[73] Assignee: Motorola, Inc., Schaumburg, Ill.

[21] Appl. No.: 79,573

[22] Filed: Jun. 22, 1993

[51] Int. Cl.⁵ .................................... H03B 19/00
[52] U.S. Cl. ................................ 327/115; 327/237; 327/291
[58] Field of Search ............... 328/15, 61, 14, 55, 328/72; 307/262, 271

[56] References Cited

U.S. PATENT DOCUMENTS

| | | | |
|---|---|---|---|
| 4,795,985 | 1/1989 | Gailbreath, Jr. | 302/262 |
| 4,914,397 | 4/1990 | Gale et al. | 328/15 |
| 4,984,186 | 1/1991 | Moeder | 328/14 |
| 5,005,141 | 4/1991 | Sanada et al. | 302/262 |
| 5,153,526 | 10/1992 | Hori et al. | 328/14 |
| 5,155,380 | 10/1992 | Hwang et al. | 302/269 |
| 5,179,348 | 1/1993 | Thompson | 302/271 |

Primary Examiner—Timothy P. Callahan
Assistant Examiner—Dinh Le
Attorney, Agent, or Firm—Jeffrey D. Nehr

[57] ABSTRACT

A method and apparatus for low power clock generation for high speed applications includes a divider for receiving a high frequency input signal and producing a low frequency input signal controlled to a high resolution. A numerically controlled oscillator (NCO) is coupled to the divider and receives a frequency word and the input signal and produces a phase advance command. The phase advance command is used to produce an output transition command. The output transition command is executed in a phase shifter in response to a phase advance/retard polarity input and a high frequency clock input signal. The phase shifter produces a low-frequency output clock signal.

23 Claims, 2 Drawing Sheets

METHOD AND APPARATUS FOR LOW POWER CLOCK GENERATION FOR HIGH SPEED APPLICATIONS

FIELD OF THE INVENTION

This invention relates in general to the generation of an output clock on a precise frequency from a higher frequency input clock and in particular to a method and apparatus for low power clock generation for high speed applications.

BACKGROUND OF THE INVENTION

The numerically controlled oscillator (NCO) is a well understood and widely used circuit for generation of an output clock signal on a precise frequency from some higher frequency input clock signal. The typical circuit for a NCO consists of an N-bit adder circuit connected between a pair of N-bit registers (an input register and an output register) so as to form a continuously integrating structure. The most significant bit of the output register, which toggles once every time the integrator overflows it N-bit numerical range, can be used as a clock in some other subsequent circuit. The output frequency is given by $F_{OUT} = F_W \times F_S$, where $F_{OUT}$ is the frequency of the output clock, $F_W$ is an integer N-bit frequency word (less than $2^{N-1}$), and $F_S$ is the frequency step size. The frequency step size is equal to a reference clock frequency divided by $2^n$, where n is the number of bits in the integration path.

One requirement of a NCO is that the adder circuit must complete its summation within one clock period of the input reference clock (i.e., within a time equal to the reciprocal of the reference clock frequency). The propagation time to accomplish the summation is generally proportional to N, the number of bits used in the adder. In addition, it is well known that for a circuit structure to be implemented using complementary metal oxide semiconductors (CMOS), the power dissipation of the resulting circuit is proportional to the input reference frequency. Consequently, for applications requiring high clock speeds relative to the time required for a circuit to sum N-bits, the NCO circuit can consume considerable power. When the propagation time required to sum the N-bits is greater than a time equal to the reciprocal of the reference clock frequency, higher levels of pipelining or faster carry-look-ahead circuits are required, necessitating additional circuit elements and increasing power consumption.

The specific problem encountered was to extend a Global Positioning Satellite (GPS) chip set technology to P-code applications necessitating a receiver generating a precise P-code rate clock at a frequency of 10.23 megahertz (MHz) from a system reference clock of 38.192 MHz. In addition, the output clock was to be controllable in frequency plus or minus 30 kilohertz (kHz) around the 10.23 MHz center frequency and controllable to a resolution, or step size, of less than 0.02 hertz (Hz).

While a standard NCO circuit could be used to generate the required code rate clock, the number of bits required to achieve the desired step size would have been at least 31 bits. The adder circuit would have to complete its summation once every clock period, i.e., about every 26 nanoseconds. However, the requirement of a 26 nanosecond add time across 31 bits exceeds the limit of current CMOS switching speeds for a simple ripple carry adder structure, and cannot be designed in CMOS without the additional complexity of carry-look-ahead structures and heavy pipelining. In addition, the power dissipation from the current in the CMOS implementation would be high because the entire circuit would operate at the 38.192 MHz system clock. Additional circuit elements to decrease the addition time and spread the addition across several clock periods would necessitate even more power dissipation.

An additional alternative method to address the present problem might be to mix two frequencies with a single sideband (SSB) mixer in an exclusive-OR implementation. One frequency could be created with a slow speed NCO or incremental phase shifter, and a second frequency created by an integer divide of the system clock. While such a scheme produces the correct output frequency, the output clock would be inappropriate for use in a spread spectrum system due to the large phase error that builds up. A large amount of phase error wobble causes correlation loss in a spread spectrum system.

Thus, what is needed is an apparatus and method for low power clock generation for high speed applications which greatly reduces power consumption and eases circuit speed problems of a conventional NCO, while being suitable for use in a spread spectrum system. It is desirable that the desired range of output frequency be small and that the ratio of input to output frequency be near some ratio of integers.

SUMMARY OF THE INVENTION

Accordingly, it is an advantage of the present invention to provide a new and improved apparatus for low power clock generation. It is a further advantage of the present invention that such clock generation is suitable for high speed applications. It is still a further advantage that the frequency step size and phase error jitter can be made to equal that of an NCO implementation.

To achieve these advantages, an apparatus for low power clock generation is contemplated which includes a divider for receiving a high frequency input signal and producing a low frequency input signal. A numerically controlled oscillator (NCO) is coupled to the divider. The NCO is for receiving a frequency word and the input signal and for producing a phase advance command. A phase advance command generator is coupled to the NCO. The phase advance command generator is for receiving the phase advance command and for producing an output transition command. A phase shifter is coupled to the command generator. The phase shifter is for executing the output transition command in response to a phase advance/retard polarity input and a high frequency clock input signal. The phase shifter also produces a low-frequency output clock signal, the desired output clock.

To further achieve these advantages, a method for providing clock generation is contemplated which includes providing a high frequency input signal. The method further includes dividing the high frequency input signal to produce an input signal and receiving a frequency word and an input signal in a numerically controlled oscillator (NCO). The NCO produces a phase advance command which is input to a command generator. The command generator produces an output transition command. The output transition command is executed in response to a phase advance/retard polarity input and a high frequency clock input signal in a phase shifter. A low frequency output clock signal is produced from the phase shifter, which is the desired output frequency.

The above and other features and advantages of the present invention will be better understood from the following detailed description taken in conjunction with the accompanying drawings.

DETAILED DESCRIPTION OF THE PREFERRED EMBODIMENT

The particular requirements listed above can be satisfied in a code rate clock for the generation of a suitable random noise code as part of a global positioning system (GPS) receiver. The application of the preferred embodiment of the invention is not limited to a GPS system, however. The embodiments described herein are for use in any application requiring precise frequency control of a clock signal.

The preferred embodiments disclosed herein create the desired output frequency and control using much less power than a standard NCO structure. The ratio of the output to the input clock frequencies in the preferred embodiments is approximately 15/56. The only constraint on the ratio is that it must be close to the ratio of two integers. The 15/56 ratio implies that a circuit that passes 15 out of every 56 input clocks will generate the desired output frequency. Control of the precise frequency (which in the preferred embodiment is plus or minus 30 kHz from the 10.23 MHz center frequency) is accomplished by adding or deleting one additional input clock cycle when the phase error between the desired frequency and the circuit output exceeds one half of one 38.192 MHz input clock.

Figure 1:
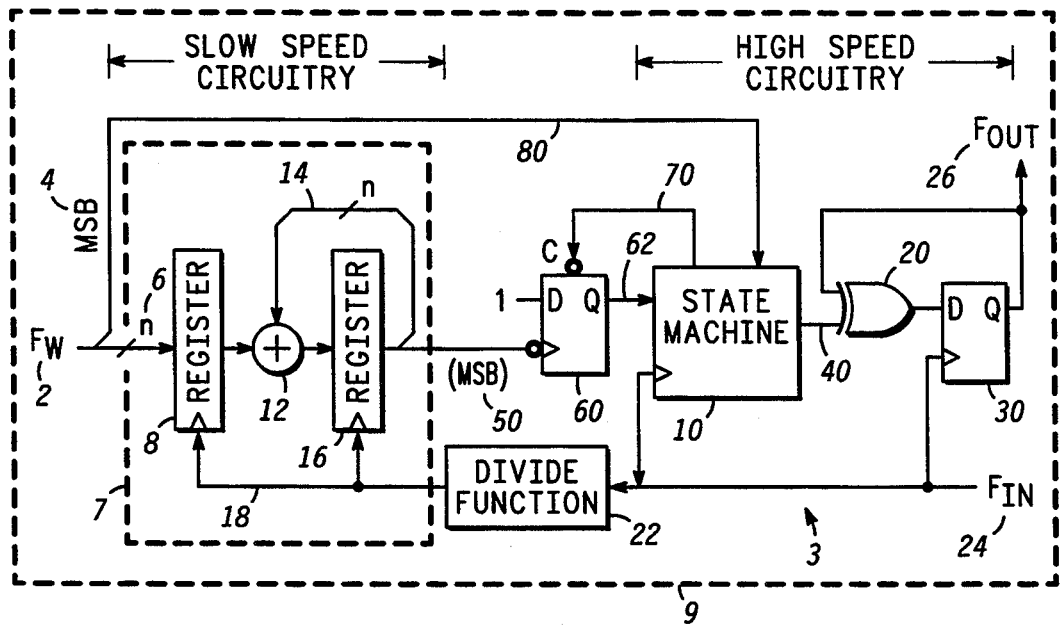
In FIG. 1, there is shown a low power clock generator in accordance with a preferred embodiment of the invention.

FIG. 1 illustrates a block diagram of a low power clock generator 3 in accordance with the preferred embodiment of the invention. Low power clock generator 3 comprises bus 6 on which frequency word ($F_W$) 2 is input. Low power clock generator 3 also comprises register 8 coupled to bus 6, adder 12 coupled to register 8, and register 16 coupled to adder 12. Bus 14 couples the output of register 16 to adder 12. The combination of bus 6, register 8, adder 12, register 16 and bus 14 comprise NCO 7.

The output of register 16, i.e. the output of NCO 7, is most significant bit (MSB) 50 and is coupled to the clock input of flip-flop 60. The D input of flip-flop 60 is held at 1, and the Q output of flip-flop 60 is coupled to state machine 10. State machine 10 provides command 70 output to the C input of flip-flop 60. The most significant bit of frequency word 2 is also input to state machine 10 as phase advance/retard polarity 80.

The output of state machine 10, i.e. signal 40, is input to a first input of exclusive OR gate 20. The output of exclusive OR gate 20 is coupled to the D input of output flip-flop 30. The Q output of output flip-flop 30 comprises $F_{OUT}$ 26, i.e. the 10.23 MHz±30 kHz output frequency signal. Output frequency signal 26 is also coupled to a second input of exclusive OR gate 20.

Input frequency signal 24, i.e. the 38.192 MHz high frequency input signal, is input to the clock input to output flip-flop 30, and the clock input of state machine 10. Input frequency signal 24 is also decreased in frequency by divide function 22 to provide an input signal 18 to both register 8 and register 16 of NCO 7. In the preferred embodiment, divide function 22 divides by a factor of 88 from the input frequency signal 24 of 38.192 MHz to provide a controlled high resolution signal 18 of 434 kHz.

In FIG. 1, registers 8 and 16 within NCO 7 comprise slow speed circuitry since they are driven by signal 18 at 434 kHz. Output flip-flop 30 and state machine 10 comprise high speed circuitry since they are driven at input frequency signal 24, the 38.192 MHz high frequency input signal.

In FIG. 1, the state machine 10 in conjunction with the exclusive OR gate 20, is programmed to either invert or to not invert the current state of the output flip-flop 30 synchronous with the next input clock, input frequency signal 24. For the particular embodiment shown, the state machine 10 has 56 states, where each state passes either a digital 1 (invert signal) or a digital 0 (not invert signal) command to the exclusive OR gate 20 and output flip-flop 30 via signal 40.

The slow speed circuitry in FIG. 1 comprises the low speed NCO 7 whose phase advance command 50 is used to command the state machine 10 to either insert one state (57th state in this example) or delete one state (i.e., 55 states) from its state transition pattern. In this way, the low power clock generator 3 shown in FIG. 1 operates as a two state incremental phase shifter. In its high speed stage, the phase shifter inserts and deletes input clock (input frequency signal 24) pulses via the N state machine in response to output 62 and clocked by high frequency input signal input frequency signal 24. In its slow speed circuitry state, the phase shifter inserts and/or deletes one additional pulse when the phase error of the output frequency signal 26 exceeds one half of one of the input clock (input frequency signal 24).

In FIG. 1, flip-flop 60 is set by the high-to-low transition of the most significant bit of the slow speed NCO 7 phase advance command 50. The setting of flip-flop 60 is a command to the state machine 10 to advance or retard one state in its state transition pattern. The state machine 10, after executing the special advance/retard function and producing signal 40 to exclusive OR gate 20, resets flip-flop 60 via command 70 in order to be ready for the next phase advance/retard command 80.

The most significant bit of the slow speed NCO 7 frequency word 2, i.e. phase advance command 50, is used to command the state machine 10 either advance or retard via advance/retard signal 80. Phase advance command 50 and flip-flop 60 tell the state machine 10 when to advance or retard. The frequency word 2 of the low speed NCO 7 is chosen so that the advance/retard operation of the state machine 10 is accomplished at a rate so as to offset the output clock frequency (output frequency signal 26) to the desired value from its nominal value.

The specific design of the state machine 10 in FIG. 1 must be carefully chosen. Not just any circuit passing 15 out of every 56 input clocks will suffice. For example, a circuit that passes the first 15 pulses and then deletes the remaining 41 clocks of a 56 clock cycle does generate the desired output frequency, but the phase error between the desired and the resulting output will be huge at all but the pattern recycle points.

The function of the state machine 10 in FIG. 1 is to generate an optimum pattern so as to minimize phase error between the desired and resulting clocks. In the present embodiment, the optimum pattern is one that spreads the 15 output clock pulses of the output frequency signal 26 uniformly across the 15 input clocks of input frequency signal 24 and minimizes the phase error on each edge. The low power clock generator 3 in FIG. 1 is shown schematically implemented within a GPS receiver 9.

The ratio of the output frequency signal 26 to input frequency signal 24 is the ratio of two integers and the denominator describes the number of states in the state machine 10. The number of states is the number of input clock pulses required (i.e. the length of the recycling pattern) in order to bring the phase error between desired and resulting signals back to zero. Assuming that the output frequency signal 26 and input frequency signal start with zero phase error, the number of states in the state machine 10 is the same number of input pulses required to bring the phase error between output frequency signal 26 and input frequency signal to zero.

Figure 2:
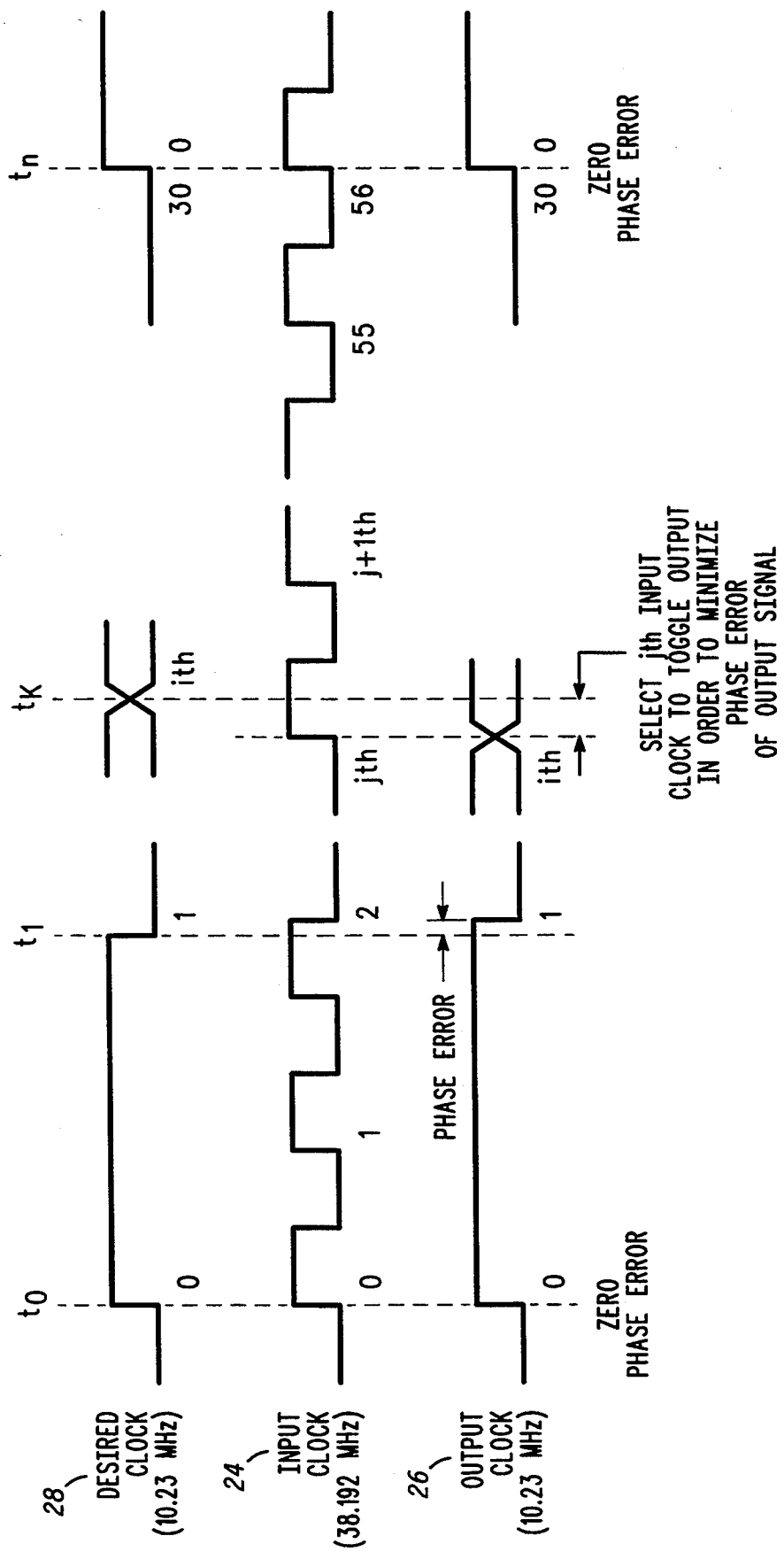
In FIG. 2, there is shown a graph over time of the input clock, desired clock and output clock from a preferred embodiment of the invention; and In FIG. 3, there is shown a preferred embodiment for a state machine suitable for use in the low power clock generator in FIG. 1.

FIG. 2 illustrates the process of picking the input frequency signal 24 rising edge to toggle the output flip-flop 30 in order to place either the rising or falling edge of the output wave form (output frequency signal 26) into the optimum location. The desired output frequency signal 26 clock in the preferred embodiment is used in a spread spectrum system requiring one half chip (i.e. clock) early and one-half chip late codes as well as a prompt code. As a result, both edges of the 10.23 MHz output signal are important and are used to produce the early, prompt and late clocks. The rising edge of the output frequency signal 26 is used to create the prompt code, while the falling edge of the signal is used to generate or clock the early and late versions of the signal. Consequently, for the examples of the preferred embodiment, both edges of the 10.23 MHz signal are important and are placed so as to minimize the phase error between input frequency signal 24 and output frequency signal 26. The preferred embodiment requires the optimum placement of each rising and falling edge of the 10.23 MHz signal which results in a 30 total edge count to be spread across the 56 input clocks.

FIG. 2 illustrates the desired 10.23 MHz wave form as desired clock 28. Desired clock 28 shows the first two edges of input clock (input frequency signal 24) labelled as 0 and 1 at times $t_0$ and $t_1$ respectively, as well as the i-th edge at time $t_k$ of the 30 total edges which end at time $t_n$. FIG. 2 also illustrates the input clock (input frequency signal 24) which describes all 56 possible input edges of the 38.192 MHz clock. The j-th labeled rising edge of the 38.192 MHz signal is shown and defined as being the closest to the i-th edge of the desired clock 28. Consequently, the problem of optimally spreading the output edges across the 56 input clocks of input clock 24 is one of finding j for all 30 output edges. For each clock, the absolute value of the difference between the i-th output edge and the j-th input edge can be calculated. In this way, the corresponding j can be found for each of the 30 desired output edges.

Figure 3:
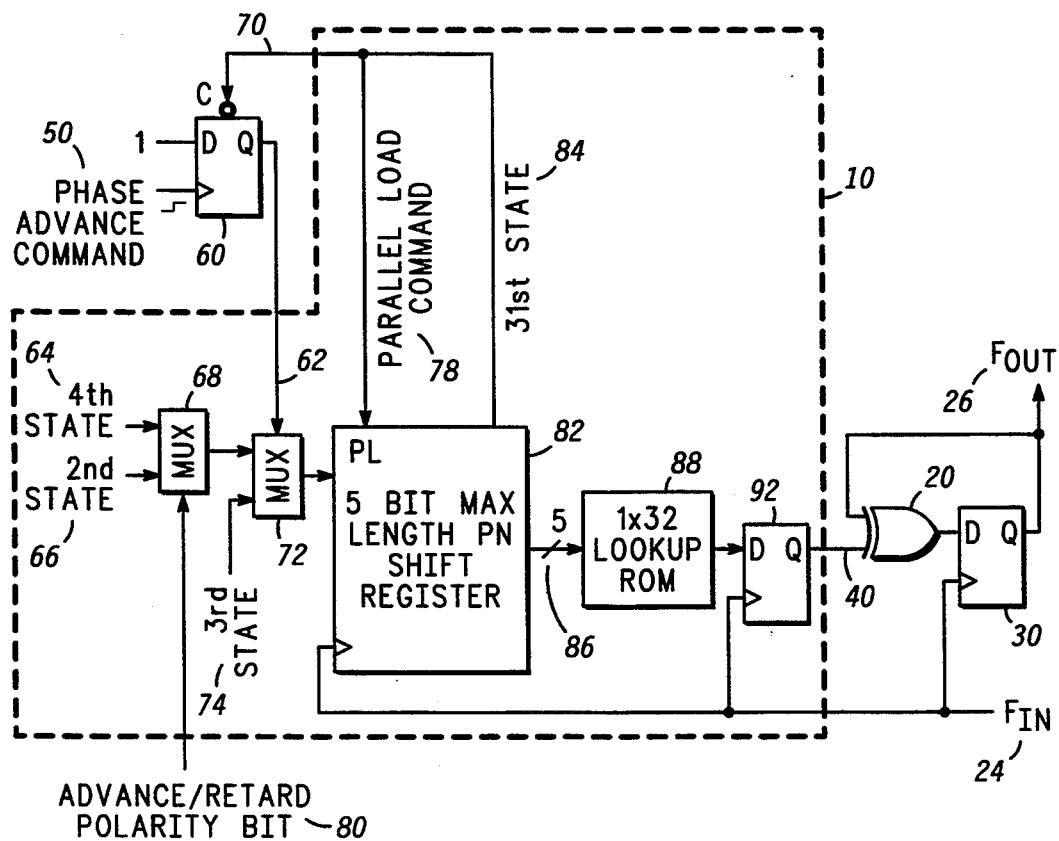

The state machine 10 in FIG. 1 can be any circuit that creates the edge toggle pattern as a function of the input clock. FIG. 3 shows a simple low power technique in accordance with a preferred embodiment of the invention for accomplishing this task. FIG. 3 illustrates a particular state machine 10 for use in the FIG. 1 embodiment. State machine 10 in FIG. 3 comprises multiplexer (MUX) 68, (MUX) 72, shift register 82, look up ROM 88, and flip-flop 92. Shift register 82 can be simply a counter. In the preferred embodiment, shift register 82 is a 5 bit maximum length pseudo random code generator shift register (state counter). Fourth state 64 and second state 66 inputs are coupled to MUX 68, as well as the advance/retard polarity bit 80 input. MUX 68 is coupled to MUX 72 via output 69. Third state 74 is input to MUX 72. As in the case of FIG. 1, phase advance command 50 is input to the clock input of flip-flop 60, the D input to flip-flop 60 is a digital 1 command. Command 70 from state machine 10 resets flip-flop 60 and the Q output of flip-flop 60 comprises output 62 to MUX 72. MUX 72 output 76 is input to shift register 82. Shift register 82 can be a 5 bit maximum length PN shift register. Shift register 82 provides output 84 comprising the reset command 70 to flip-flop 60. Shift register 82 also accepts parallel load command 78 linked to the reset input of flip-flop 60. Bus 86, which can be a 5-bit bus, couples shift register 82 to look up ROM 88. Look up ROM 88 can be a 1X32 look up ROM. The output of look up ROM 88 provides the D input to flip-flop 92.

The Q output of flip-flop 92, i.e. signal 40, provides one input to exclusive OR gate 20, as in FIG. 1. The exclusive OR gate 20 output provides the D input to output flip-flop 30, again as in FIG. 1. The Q output of output flip-flop 30 comprises output frequency signal 26, i.e. the 10.23 MHz output signal, which is also coupled to a second input to exclusive OR gate 20. Input frequency signal 24, i.e. the 38.192 MHz input signal, is input as the clock signal to shift register 82, flip-flop 92 and output flip-flop 30.

In the FIG. 3 embodiment, both edges of the output wave form output frequency signal 26 are important. As a result, the effective output frequency signal 26 to input frequency signal 24 ratio becomes 30/56, considering both wave form edges. This ratio reduces to 15/28, effectively reducing the number of states in the state machine 10 by a factor of 2. In FIG. 3, the state machine 10 consists of a maximum length PN sequence generator made from a 5 bit shift register 82, with appropriate internal (not shown) exclusive OR feedback in order to step the shift register 82 through all of its states. The five bit shift register 82 has 31 states, of which the last 28 states are used. The state machine 10 detects the 31st state 84 of the shift register 82 and creates a parallel load command via PL command 78 of the shift register 82 flip-flop 60. One of the plurality of states from the state machine 10 is pre-loaded into the shift register 82 in response to the multiplexer 72 output.

The third state 74 of the PN sequence is applied most of the time to the parallel load input of the shift register 82 via multiplexer 72. The shift register sequencer (i.e. machine or counter 10) steps between the third state 74 and the 31st state 84, producing a total of 28 states in the sequence. The look-up ROM 88 attached to the shift register 82 output stores the optimum output flip-flop 92 toggle pattern as a function of a shift register 82 state. The look-up ROM 88 translates the state of the shift register 82 into the state number, and produces the optimum flip-flop 92 toggle pattern for each of the 28 possible machine states.

In order to advance or retard the phase of the entire pattern in FIG. 3, the phase advance command 50 sets flip-flop 60 and forces multiplexer 68 to select either the second state 66 or the fourth state 64, respectively. The selection is made by muliplexer 72. Phase advance command 50 causes the shift register 82 to be reset to its second state 66 or its fourth state 64, which delays or advances the 10.23 MHz output clock (output frequency signal 26) by one 38.192 MHz clock, depending on the advance/retard polarity bit 80. Command 70 resets flip-flop 60 to be ready for the next phase advance command 50. The second state 66 of the state machine 10 is programmed to not toggle flip-flop 92.

A short cycled maximum length shift register 82 is used in FIG. 3 instead of a counter because it consumes less power. The number of gates to implement the shift register 82 state machine 10 is considerably less than a counter embodiment since the power dissipation is proportional to the number of gates and the clock rate. A simple low power ROM look-up table 88 is used to store the optimum toggle sequence because ROM tables consume much less power and less chip area than any other integrated circuit structure.

Thus, the low speed circuitry described operates at substantially less than the system clock rate (input frequency signal 24), and the high speed circuitry necessary to accomplish the state machine 10, exclusive OR gate 20, and output flip-flop 30 is small. The resulting power dissipation is considerably less for a CMOS implementation than that consumed by a conventional NCO, even though the amount of circuitry, specifically the number of gates, is probably greater. The frequency step size and phase error jitter can be made to equal that of an NCO implementation. The method and apparatus contemplated herein is thus suitable for battery powered hand-held applications.

Thus, a method and apparatus for low power clock generation for high speed applications has been described which overcomes specific problems and accomplishes certain advantages relative to prior art methods and mechanisms. The improvements over known technology are significant. The device and method greatly reduces power consumption and eases circuit speed problems of a conventional NCO, while being suitable for use in a spread spectrum system. The device and method accommodate a small desired range of output frequency where the ratio of input to output frequency is near the ratio of two integers. The clock generation method and apparatus is suitable for high speed applications, and the frequency step size and phase error jitter can be made to equal that of an NCO implementation.

Thus, there has also been provided, in accordance with an embodiment of the invention, a method and apparatus for low power clock generation for high speed applications that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. An apparatus for low power clock generation comprising:
   a dividing means for receiving a high frequency input signal and producing a low frequency input signal;
   a numerically controlled oscillator (NCO) coupled to the dividing means, the NCO for receiving a frequency word and the low frequency input signal and for producing a phase advance command;
   a command means coupled to the NCO, the command means for receiving the phase advance command and for producing an output transition command; and
   a phase shifter coupled to the command means, the phase shifter for executing the output transition command in response to a phase advance/retard polarity input and a high frequency clock input signal and for producing a low-frequency output clock signal.

2. An apparatus as claimed in claim 1, wherein the NCO comprises:
   a first register for receiving the frequency word and the low frequency input signal and for producing a first register output;
   an adder coupled to the first register, the adder for receiving the first register output as a first adder input and for producing an adder output;
   a second register coupled to the adder, the second register for receiving the adder output and the low frequency input signal and producing a second register output comprising the phase advance command; and
   a bus coupled between the second register and the adder such that the second register output is input to the adder as a second adder input.

3. An apparatus as claimed in claim 1, wherein the command means comprises a phase advance command flip-flop for receiving the phase advance command from the NCO and for producing the output transition command.

4. An apparatus as claimed in claim 1, wherein the phase shifter comprises a state machine for receiving the output transition command, a phase advance/retard polarity command from the frequency word, and the high frequency input signal and for producing a state machine output signal in response thereto.

5. An apparatus as claimed in claim 4, wherein the phase shifter further comprises:
   an exclusive OR gate coupled to the state machine, the exclusive OR gate for receiving the state machine output signal and for producing an exclusive OR output; and
   an output flip flop for receiving the exclusive OR gate output and the high frequency input signal and for producing the low frequency output clock signal.

6. An apparatus as claimed in claim 4, wherein the state machine comprises multiplexing means for receiving the advance/retard polarity bit and producing a multiplexing means output.

7. An apparatus as claimed in claim 6, wherein the state machine further comprises a shift register coupled to the multiplexing means, the shift register having a plurality of states, wherein one of the plurality of states is pre-loaded into the shift register in response to the multiplexing means output.

8. An apparatus as claimed in claim 7, wherein the state machine further comprises:
   a state machine flip flop; and
   a lookup read only memory (ROM) coupled between the shift register and the state machine flip flop, the lookup ROM for storing an optimum state machine flip flop toggle pattern for each of the plurality of states.

9. A method for the low power generation of a clock signal, the method comprising the steps of:
   providing a high frequency input signal;

dividing the high frequency input signal to produce an input signal;

receiving a frequency word and an input signal in a numerically controlled oscillator (NCO);

producing a phase advance command from the NCO;

receiving the phase advance command in a command generator;

producing an output transition command from the command generator;

executing the output transition command in response to a phase advance/retard polarity input and a high frequency clock input signal in a phase shifter; and producing a low frequency output clock signal from the phase shifter.

10. A method as claimed in claim 9, wherein the step of producing a phase advance command from the NCO comprises the steps of:

inputting the frequency word and a low frequency clock signal into a first register, the first register providing a first register output;

continuously integrating the first register output in an adder;

generating an adder output from the adder to an output register; and providing the phase advance command from the output register in response to the adder output.

11. A method as claimed in claim 10, wherein the step of producing an output transition command from the command generator comprises the step of producing a flip-flop output from a first flip-flop in response to a high-to-low transition of a most significant bit (MSB) of the phase advance command from the output register.

12. A method as claimed in claim 11, wherein the step of executing the output transition command in response to a phase advance/retard polarity input and a high frequency clock input signal comprises the steps of:

transitioning one state of a state machine when a phase error of the low frequency clock output signal compared to a desired clock signal exceeds one-half of an input clock pulse; and resetting the first flip-flop after the step of transitioning.

13. A method as claimed in claim 12, wherein the step of transitioning one state comprises the steps of:

producing a digital signal from the state machine in response to the phase advance/retard polarity input; and advancing a phase of the low frequency clock output signal one clock pulse when the phase advance/retard polarity input is zero.

14. A method as claimed in claim 13, wherein the step of advancing comprises the steps of:

selecting a next reset state in a shift register using a multiplexer;

resetting the shift register in response to the phase advance command; and changing the low frequency clock output signal depending upon the phase advance/retard polarity bit.

15. A method as claimed in claim 14, wherein the step of advancing further comprises the steps of:

stepping the shift register through a plurality of states; and storing an optimum flip flop toggle pattern as a function of the plurality of states.

16. A global positioning satellite (GPS) receiver having a low power clock generator comprising:

a dividing means for receiving a high frequency input signal and producing a low frequency input signal;

a numerically controlled oscillator (NCO) coupled to the dividing means, the NCO for receiving a frequency word and the low frequency input signal and for producing a phase advance command;

a command means coupled to the NCO, the command means for receiving the phase advance command and for producing an output transition command; and a phase shifter coupled to the command means, the phase shifter for executing the output transition command in response to a phase advance/retard polarity input and a high frequency clock input signal and for producing a low-frequency output clock signal.

17. A GPS receiver as claimed in claim 16, wherein the NCO comprises:

a first register for receiving the frequency word and the input signal and for producing a first register output;

an adder coupled to the first register, the adder for receiving the first register output as a first adder input and for producing an adder output;

a second register coupled to the adder, the second register for receiving the adder output and the input signal and producing a second register output comprising the phase advance command; and a bus coupled between the second register and the adder such that the second register output is input to the adder as a second adder input.

18. A GPS receiver as claimed in claim 16, wherein the command means comprises a phase advance command flip-flop for receiving the phase advance command from the NCO and for producing the output transition command.

19. A GPS receiver as claimed in claim 16, wherein the phase shifter comprises a state machine for receiving the output transition command, a phase advance/retard polarity command from the frequency word, and the high frequency input signal and for producing a state machine output signal in response thereto.

20. A GPS receiver as claimed in claim 19, wherein the phase shifter further comprises:

an exclusive OR gate coupled to the state machine, the exclusive OR gate for receiving the state machine output signal and for producing an exclusive OR output; and an output flip flop for receiving the exclusive OR gate output and the high frequency input signal and for producing the low frequency output clock signal.

21. A GPS receiver as claimed in claim 19, wherein the state machine comprises multiplexing means for receiving the advance/retard polarity bit and producing a multiplier means output.

22. A GPS receiver as claimed in claim 21, wherein the state machine further comprises a shift register coupled to the multiplexing means, the shift register having a plurality of states, wherein one of the plurality of states is selected in response to the multiplexing means output.

23. A GPS receiver as claimed in claim 22, wherein the state machine further comprises:

a state machine flip flop; and a lookup read only memory (ROM) coupled between the shift register and the state machine flip flop, the lookup ROM for storing an optimum state machine flip flop toggle pattern for reach of the plurality of states.

* * * * *

UNITED STATES PATENT AND TRADEMARK OFFICE
CERTIFICATE OF CORRECTION

PATENT NO.   : 5,365,182
DATED        : November 15, 1994
INVENTOR(S)  : Thomas Michael King It is certified that error appears in the above-indentified patent and that said Letters Patent is hereby corrected as shown below:

In column 10, claim 23, line 67, the word "reach" should be --each--.

Signed and Sealed this

Seventeenth Day of October, 1995

Attest:

BRUCE LEHMAN

Attesting Officer

Commissioner of Patents and Trademarks